US007398103B2

(12) United States Patent
Furutani et al.

(10) Patent No.: US 7,398,103 B2
(45) Date of Patent: *Jul. 8, 2008

(54) HIGH-FREQUENCY MODULE AND MOBILE COMMUNICATION APPARATUS USING THE SAME

(75) Inventors: Koji Furutani, Okayama (JP); Norio Nakajima, Takatsuki (JP); Tetsuro Harada, Yasu-gun (JP); Yoshiki Takada, Oku-gun (JP); Akihiro Ochii, Yasu-gun (JP)

(73) Assignee: Murata Manufacturing Co., Ltd., Kyoto ( * ) Notice: Subject to any disclaimer, the term of this patent is extended or adjusted under 35 U.S.C. 154(b) by 212 days.

This patent is subject to a terminal disclaimer.

(21) Appl. No.: 10/879,913

(22) Filed: Jun. 29, 2004

(65) Prior Publication Data
US 2004/0242189 A1 Dec. 2, 2004

Related U.S. Application Data

(63) Continuation of application No. 09/903,834, filed on Jul. 12, 2001, now Pat. No. 6,788,958.

(30) Foreign Application Priority Data
Jul. 27, 2001 (JP) ............................ 2000-227631

(51) Int. Cl.
*H04M 1/00* (2006.01)
(52) U.S. Cl. ..................... 455/552.1; 455/80; 455/78
(58) Field of Classification Search .............. 455/552.1, 455/403, 428, 435.2, 553.1, 550.1, 80, 83, 455/78; 333/133, 103
See application file for complete search history.

(56) References Cited

U.S. PATENT DOCUMENTS

| 5,153,539 | A | * | 10/1992 | Hara et al. ................. 333/182 |
| 5,162,822 | A | * | 11/1992 | Wakamori ................. 333/193 |
| 5,406,235 | A | * | 4/1995 | Hayashi .................... 333/204 |
| 5,783,976 | A | | 7/1998 | Furutani et al. |
| 5,859,473 | A | | 1/1999 | Ikata et al. |
| 5,990,732 | A | | 11/1999 | Furutani et al. |
| 5,999,065 | A | | 12/1999 | Furutani et al. |
| 6,060,960 | A | | 5/2000 | Tanaka et al. |
| 6,185,418 | B1 | | 2/2001 | MacLellan et al. |
| 6,269,253 | B1 | | 7/2001 | Maegawa et al. |

(Continued)

FOREIGN PATENT DOCUMENTS

DE 198 53 484 A1 5/1999

(Continued)

OTHER PUBLICATIONS

Official communication issued in the counterpart Japanese Application No. 2005-011997, mailed on Sep. 25, 2007.

*Primary Examiner*—Tan Trinh
(74) *Attorney, Agent, or Firm*—Keating & Bennett, LLP

(57) ABSTRACT

A high-frequency module includes a diplexer, first and second high-frequency switches, a SAW duplexer, first and second LC filters functioning as first and second filters, and an SAW filter functioning as a third filter, the module defines a unit that integrates front-end sections of first to third communication systems, a digital cellular system (1.8 GHz band), a personal communication service (1.9 GHz band) and a global system for mobile communications (900 MHz band).

20 Claims, 8 Drawing Sheets

U.S. PATENT DOCUMENTS

| | | | |
|---|---|---|---|
| 6,380,823 B1 * | 4/2002 | Ikata et al. | 333/133 |
| 6,766,149 B1 * | 7/2004 | Hikita et al. | 455/83 |
| 6,788,958 B2 * | 9/2004 | Furutani et al. | 455/552.1 |
| 6,870,442 B1 * | 3/2005 | Suzuki et al. | 333/133 |
| 2002/0039056 A1 * | 4/2002 | Kawachi et al. | 333/193 |
| 2002/0137471 A1 * | 9/2002 | Satoh et al. | 455/83 |

FOREIGN PATENT DOCUMENTS

| | | |
|---|---|---|
| DE | EP 1 014 592 A2 | 9/1999 |
| DE | EP 1 003 291 A2 | 12/1999 |
| EP | 1 003 291 | 5/2000 |
| EP | 1 014 592 | 6/2000 |
| GB | 2 333 669 | 7/1999 |
| GB | 2 333 669 A | 7/1999 |
| GB | 2333669 A  * | 7/1999 |
| JP | 6-350307 | 12/1994 |
| JP | 09-098046 A | 4/1997 |
| JP | 10-041704 | 2/1998 |
| JP | 10-313229 | 11/1998 |
| JP | 11-154804 | 6/1999 |
| JP | 2000-165273 | 6/2000 |
| JP | 2000-165274 | 6/2000 |
| JP | 2000-165288 | 6/2000 |
| JP | 2000-183780 | 6/2000 |
| JP | 2000-188522 | 7/2000 |

* cited by examiner

HIGH-FREQUENCY MODULE AND MOBILE COMMUNICATION APPARATUS USING THE SAME

This application is a Continuation Application of U.S. patent application Ser. No. 09/903,834 filed Jul. 12, 2001, now U.S. Pat. No. 6,788,958 currently pending.

BACKGROUND OF THE INVENTION

1. Field of the Invention

The present invention relates to high-frequency modules and mobile communication apparatuses including high-frequency modules, and more particularly, to a high-frequency module which can be shared by three different communication systems and a mobile communication apparatus including such a high-frequency module.

2. Description of the Related Art

A triple-band portable telephone has been proposed which can operate in a plurality of frequency bands, such as those in a digital cellular system (DCS) using the 1.8 GHz band, a personal communication service (PCS) using the 1.9 GHz band, and a global system for mobile communications (GSM) using the 900 MHz, as a mobile communication apparatus.

FIG. 12 is a block diagram of a front-end section of a general triple-band portable telephone. FIG. 12 shows a case in which first to third communication systems having frequencies that are different from each other are set to the DCS using the 1.8 GHz, the PCS using the 1.9 GHz, and the GSM using the 900 MHz.

The front-end section of the triple-band portable telephone is provided with an antenna 1, a diplexer 2, first to third high-frequency switches 3a to 3c, first and second LC filters 4a and 4b, and first to third SAW filters 5a to 5c. The diplexer 2 couples a transmission signal sent from one of the DCS, the PCS, and the GSM with the antenna 1 during transmission, and distributes a receiving signal sent from the antenna 1 to one of the DCS, the PCS, and the GSM during receiving. The first high-frequency switch 3a switches between the transmission-section side of the DCS and the PCS, and the receiving-section side of the DCS and the PCS. The second high-frequency switch 3b switches between the receiving section Rxd side of the DCS and the receiving section Rxp side of the PCS. The third high-frequency switch 3c switches between the transmission-section Txg side and the receiving section Rxg side of the GSM. The first LC filter 4a passes transmission signals for the DCS and the PCS and attenuates the harmonics of the transmission signals. The second LC filter 4b passes a transmission signal for the GSM and attenuates the harmonics of the transmission signal. The first SAW filter 5a passes a receiving signal for the DCS and attenuates the harmonics of the receiving signal. The second SAW filter 5b passes a receiving signal for the PCS and attenuates the harmonics of the receiving signal. The third SAW filter 5c passes a receiving signal for the GSM and attenuates the harmonics of the receiving signal.

The operation of the triple-band portable telephone will be described for the DCS first. During transmission, the first high-frequency switch 3a turns on the transmission section Txdp side to send a transmission signal that was sent from the transmission section Txdp and that has passed through the first LC filter 4a, to the diplexer 2, the diplexer 2 performs coupling, and then the signal is sent from the antenna 1. During receiving, a receiving signal received by the antenna 1 is distributed by the diplexer 2, the receiving signal sent from the antenna 1 is sent to the first switch 3a, which is located on the DCS and PCS side, the first high-frequency switch 3a turns on the receiving section side to send the signal to the second high-frequency switch 3b, and the second high-frequency switch 3b turns on the receiving section Rxd side of the DCS to send the signal to the receiving section Rxd of the DCS through the first SAW filter 5a. A similar operation is also performed for transmission and receiving for the PCS.

A case in which the GSM is used will be described next. During transmission, the third high-frequency switch 3c turns on the transmission section Txg side to send a transmission signal which was sent from the transmission section Txg and has passed the second LC filter 4b, to the diplexer 2, the diplexer 2 performs coupling, and the signal is sent from the antenna 1. During receiving, a receiving signal received by the antenna 1 is distributed by the diplexer 2, the receiving signal sent from the antenna 1 is sent to the third high-frequency switch 3c, and the third high-frequency switch 3c turns on the receiving section Rxg side to send the signal to the receiving section Rxg of the GSM through the third SAW filter 5c.

Since the triple-band portable telephone, which is one of the conventional mobile communication apparatuses, uses three high-frequency switches, at least six diodes constituting the high-frequency switches are required. As a result, the triple-band portable telephone uses a very large amount of power, and a battery mounted to the triple-band portable telephone can be used only for a short period. Also, the operation of each diode is controlled in many operation modes, and thus, a complicated circuit is required.

SUMMARY OF THE INVENTION

In order to overcome the problems described above, preferred embodiments of the present invention provide a high-frequency module having a low power consumption and a compact circuit, and a mobile communication apparatus including such a high-frequency module.

According to a preferred embodiment of the present invention, a high-frequency module includes integrated front-end sections of first to third communication systems having frequencies that are different from each other, the high-frequency module includes a diplexer arranged to couple a transmission signal sent from any of the first to third communication systems to an antenna during transmission and arranged to distribute a receiving signal sent from the antenna to any of the first to third communication systems during receiving, a first high-frequency switch arranged to separate a transmission section for the first and second communication systems and receiving sections for the first and second communication systems, a SAW duplexer arranged to separate a receiving section for the first communication system and a receiving section for the second communication system, and a second high-frequency switch arranged to separate a transmission section and a receiving section for the third communication system.

The high-frequency module may further include at least one of a first filter arranged to pass a transmission signal sent from the first and second communication systems, a second filter arranged to pass a transmission signal sent from the third communication system, and a third filter arranged to pass a receiving signal for the third communication system.

In the high-frequency module, the SAW duplexer may include a SAW filter and a phase conversion component connected to the SAW filter.

According to another preferred embodiment of the present invention, a high-frequency module includes front-end sections of first to third communication systems having frequencies that are different from each other, the front-end sections including a diplexer arranged to couple a transmission signal sent from any of the first to third communication systems to an antenna during transmission and arranged to distribute a receiving signal sent from the antenna to any of the first to third communication systems during receiving, a first high-frequency switch arranged to separate a transmission section for the first and second communication systems and receiving sections for the first and second communication systems, a SAW duplexer arranged to separate a receiving section for the first communication system and a receiving section for the second communication system, and a second high-frequency switch arranged to separate a transmission section and a receiving section for the third communication system, wherein the diplexer, the first and second high-frequency switches, and the SAW duplexer are integrated in a laminated member including a plurality of laminated sheet layers.

The high-frequency module may be configured such that all elements of the diplexer and a portion of the elements of the first and second high-frequency switches and the SAW duplexer are built in the laminated member, and the remaining elements of the first and second high-frequency switches and the SAW duplexer are mounted on the laminated member.

According to a high-frequency module of various preferred embodiments of the present invention, since a diplexer, first and second high-frequency switches, and an SAW duplexer are provided, and the SAW duplexer separates a receiving section for a first communication system and a receiving section for a second communication system, the number of high-frequency switches is reduced. As a result, the number of diodes used is reduced, and the power consumption of the high-frequency modules is greatly reduced. This means that a low-power-consumption, high-frequency module is provided. In addition, a current is not required during the signal receiving operation.

Since the diplexer, the first and second high-frequency switches, and the SAW duplexer, which constitute the high-frequency module, are integrated into a laminated member obtained by laminating a plurality of sheet layers preferably formed of ceramic, the matching characteristic, the attenuation characteristic, or the isolation characteristic of each component is obtained. Therefore, a matching circuit is not required between the diplexer and the first and second high-frequency switches, or between the first high-frequency switch and the SAW duplexer. Consequently, the high-frequency module becomes much more compact than conventional devices.

The diplexer preferably includes inductors and capacitors. The first and second high-frequency switches preferably include diodes, inductors, and capacitors. The SAW duplexer preferably includes SAW filters and transmission lines. The first and second LC filters preferably include inductors and capacitors. These elements are built in, or mounted on a laminated member and are connected by connections disposed inside of the laminated member. Therefore, the high-frequency module is constituted by a single laminated member and is very compact. In addition, loss caused by wirings for connecting components is greatly reduced, and as a result, the loss of the entire high-frequency module is greatly reduced.

Since the lengths of the inductors and the transmission lines built in the laminated member are reduced by a wavelength reduction effect, the insertion losses of these inductors and the transmission lines are greatly reduced. Therefore, a compact and low-loss high-frequency module is provided.

According to another preferred embodiment of the present invention, a mobile communication apparatus includes a high-frequency module according to one of the preferred embodiments described above, which high-frequency module defines the front-end sections of the first to third communication systems, receiving sections for the first to third communication systems, and transmission sections for the first to third communication systems.

According to a mobile communication apparatus of a preferred embodiment of the present invention, since a front-end section defined by a high-frequency module which allows power consumption to be reduced is provided, the power consumption of the mobile communication apparatus itself can also be reduced.

According to a mobile communication apparatus of various preferred embodiments of the present invention, since a high-frequency module used can reduce power consumption and does not require a current during receiving, the mobile communication apparatus having this high-frequency module can have low power consumption and does not require any current when waiting for a call. As a result, a battery mounted in the mobile communication apparatus can be used for a much longer period than in conventional devices.

In addition, since the compact and low-loss high-frequency module is used, the mobile communication apparatus having this high-frequency module is made compact and has a high performance.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
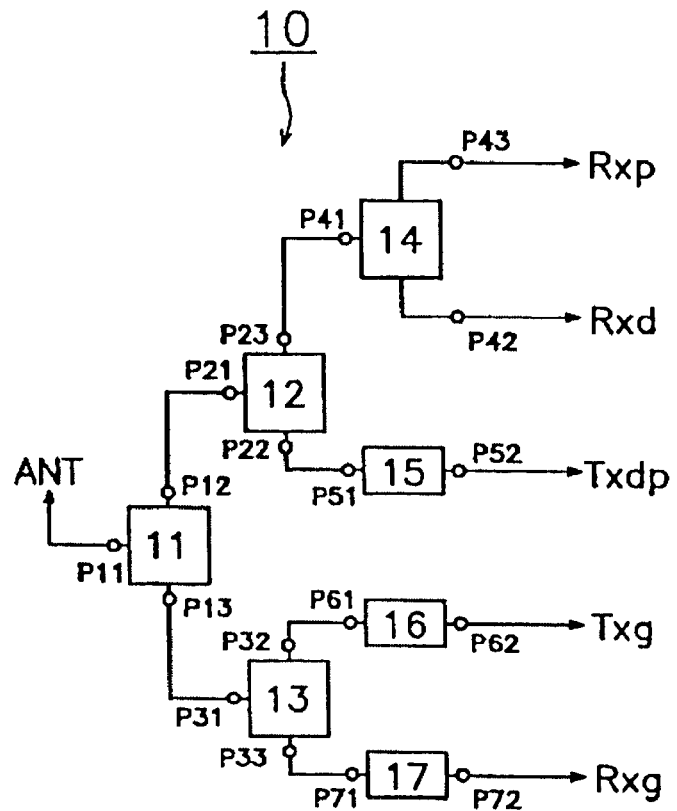
FIG. 1 is a block diagram of a high-frequency module according to a preferred embodiment of the present invention.

Preferred embodiments of the present invention will be described below by referring to the drawings.

FIG. 1 is a block diagram of a high-frequency module 10 according to a preferred embodiment of the present invention. The high-frequency module 10 preferably includes a diplexer 11, first and second high-frequency switches 12 and 13, a SAW duplexer 14, first and second LC filters 15 and 16 defining first and second filters, and a SAW filter 17 defining a third filter, and functions as a front end section of first to third communication systems, preferably, a DCS (1.8 GHz band), a PCS (1.9 GHz band), and a GSM (900 MHz band).

A first port P11 of the diplexer 11 is connected to an antenna ANT, a second port P12 is connected to a first port P21 of the first high-frequency switch 12, and a third port P13 is connected to a first port P31 of the second high-frequency switch 13.

A second port P22 of the first high-frequency switch 12 is connected to a first port P51 of the first LC filter 15, and a third port P23 is connected to a first port P41 of the SAW duplexer 14.

A second port P52 of the first LC filter 15 is connected to a transmission section Txdp shared by the DCS and the PCS, and second and third ports P42 and P43 of the SAW duplexer 14 are connected to a receiving section Rxd of the DCS and a receiving section Rxp of the PCS, respectively.

A second port P32 of the second high-frequency switch 13 is connected to a first port P61 of the second LC filter 16, and a third port P33 is connected to a first port P71 of the SAW filter 17.

A second port P62 of the second LC filter 16 is connected to a transmission section Txg of the GSM, and a second port P72 of the SAW filter 17 is connected to a receiving section Rxg of the GSM.

Figure 2:
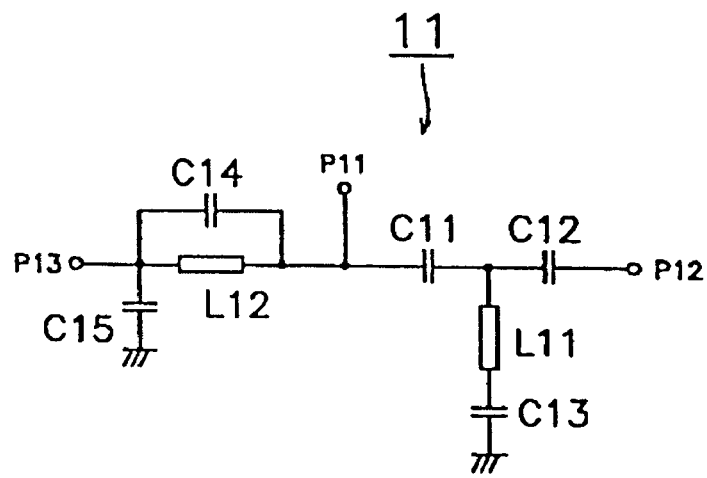
FIG. 2 is a circuit diagram of a diplexer constituting the high-frequency module shown in FIG. 1.

FIG. 2 is a circuit diagram of the diplexer 11 constituting the high-frequency module shown in FIG. 1. The diplexer 11 is provided with the first to third ports P11 to P13, inductors L11 and L12, and capacitors C11 to C15.

Between the first port P11 and the second port P12, the capacitors C11 and C12 are connected in series. The connection point between them is grounded through the inductor L11 and the capacitor C13.

Between the first port P11 and the third port P13, a parallel circuit including the first inductor L12 and the first capacitor C14 is connected. An end of the parallel circuit located at the third port P13 side is grounded through the first capacitor C15.

In other words, a high-pass filter which passes transmission and receiving signals in the DCS (1.8 GHz band) and the PCS (1.9 GHz band) is defined between the first port P11 and the second port P12. A low-pass filter which passes transmission and receiving signals in the GSM (900 MHz band) is defined between the first port P11 and the third port P13.

Figure 3:
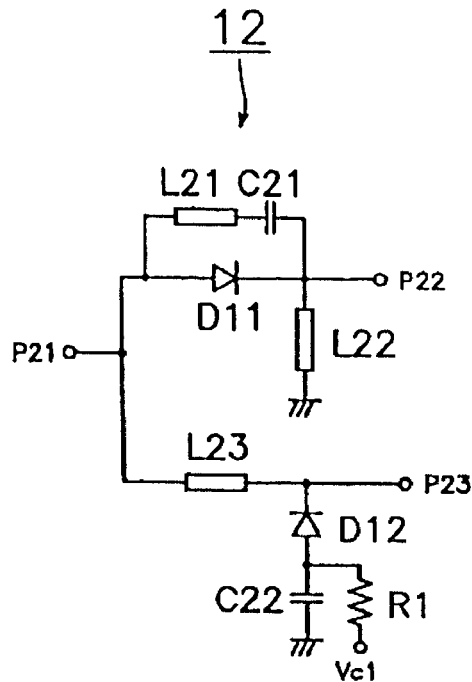
FIG. 3 is a circuit diagram of a first high-frequency switch constituting the high-frequency module shown in FIG. 1.

FIG. 3 is a circuit diagram of the first high-frequency switch 12 constituting the high-frequency module shown in FIG. 1. The first high-frequency switch 12 is provided with the first to third ports P21 to P23, a control terminal Vc1, diodes D11 and D12, inductors L21 to L23, capacitors C21 and C22, and a resistor R1.

Between the first port P21 and the second port P22, the diode D11 is connected such that its anode is disposed at the first port P21 side. The diode 11 is also connected in parallel to a series circuit including the inductor L21 and the capacitor C21. The second port P22 side of the diode D11, namely, its cathode, is grounded through the inductor L22 defining a choke coil.

Between the first port P21 and the third port P23, the inductor L23 is connected. The third port P23 side of the inductor L23 is grounded through the diode D12 and the capacitor C22. The connection point of the anode of the diode D12 and the capacitor C22 is connected to the control terminal Vc1 through the resistor R1.

Figure 4:
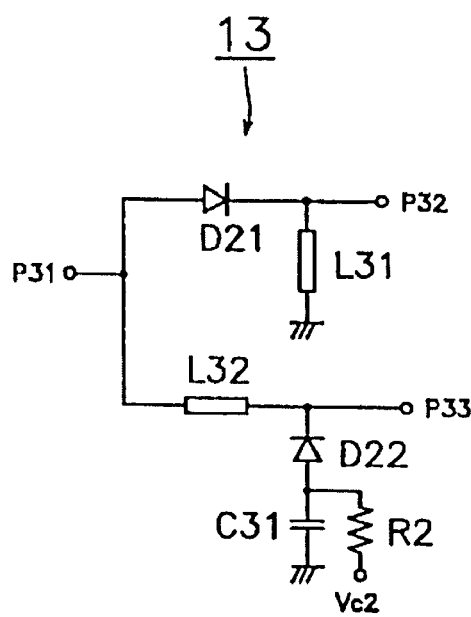
FIG. 4 is a circuit diagram of a second high-frequency switch constituting the high-frequency module shown in FIG. 1.

FIG. 4 is a circuit diagram of the second high-frequency switch 13 constituting the high-frequency module shown in FIG. 1. The second high-frequency switch 13 is provided with the first to third ports P31 to P33, a control terminal Vc2, diodes D21 and D22, inductors L31 and L32, a capacitor C31, and a resistor R2.

Between the first port P31 and the second port P32, the diode D21 is connected such that its anode is disposed at the first port P31 side. The second port P32 side of the diode D21, namely, its cathode, is grounded through the inductor L31 defining a choke coil.

Between the first port P31 and the third port P33, the inductor L32 is connected. The third port P33 side of the inductor L32 is grounded through the diode D22 and the capacitor C31. The connection point of the anode of the diode D22 and the capacitor C31 is connected to the control terminal Vc2 through the resistor R2.

Figure 5:
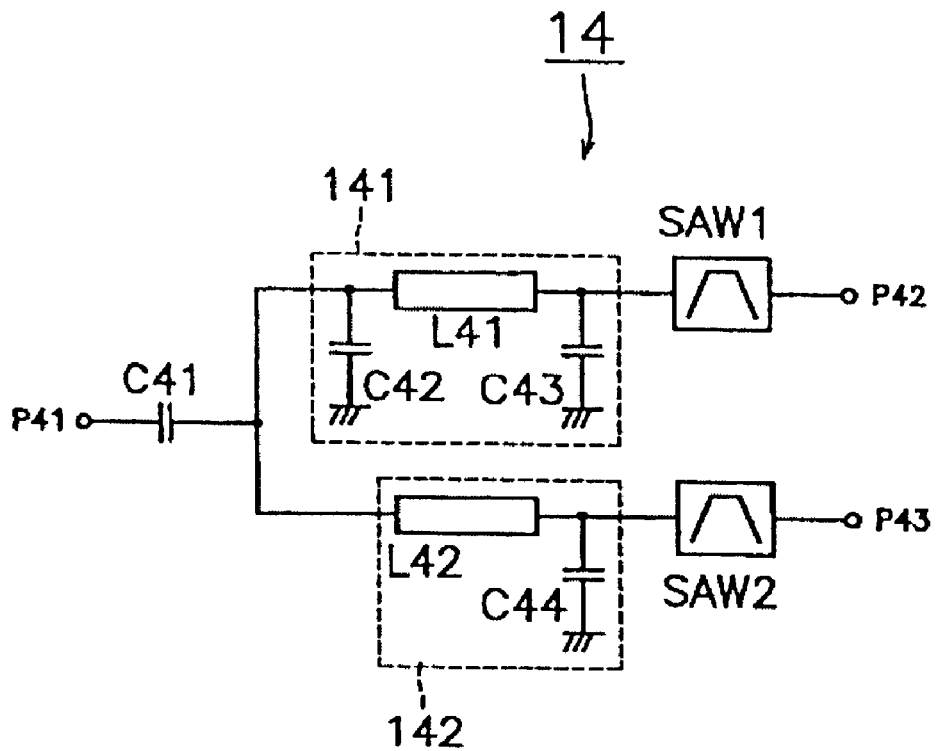
FIG. 5 is a circuit diagram of a SAW duplexer constituting the high-frequency module shown in FIG. 1.

FIG. 5 is a circuit diagram of the SAW duplexer 14 constituting the high-frequency module shown in FIG. 1. The SAW duplexer 14 is provided with the first to third ports P41 to P43, SAW filters SAW1 and SAW2, inductors L41 and L42, and capacitors C41 to C44. Between the first port P41 and the second port P42, the capacitor C41, the SAW filter SAW1, and a phase conversion unit 141 are connected in series. Between the first port P41 and the third port P43, the capacitor C41, the SAW filter SAW2, and a phase conversion unit 142 are connected in series.

The phase conversion unit 141 includes the inductor L41 and the capacitors C42 and C43. Both ends of the inductor L41 are connected to the ground through the capacitors C42 and C43. The phase conversion unit 142 includes the inductor L42 and the capacitor C44. The SAW filter SAW2 side of the inductor L42 is connected to the ground through the capacitor C44.

In the phase conversion unit 141, the inductance of the inductor L41 and the capacitances of the capacitors C42 and C43 are specified such that the input impedance of the SAW filter SAW1 is open in the frequency band (1.8 GHz band) of the DCS connected to the second port P42. In the same way, in the phase conversion unit 142, the inductance of the inductor L42 and the capacitance of the capacitors C44 are specified such that the input impedance of the SAW filter SAW2 is open in the frequency band (1.9 GHz band) of the PCS connected to the third port P43.

Figure 6:
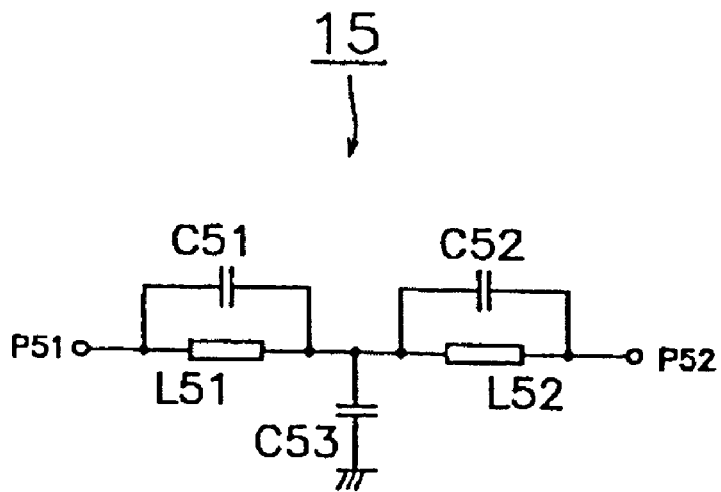
FIG. 6 is a circuit diagram of a first LC filter constituting the high-frequency module shown in FIG. 1.

FIG. 6 is a circuit diagram of the first LC filter 15 constituting the high-frequency module shown in FIG. 1. The first LC filter 15 is provided with the first and second ports P51 and P52, inductors L51 and L52, and capacitors C51 to C53.

Between the first port P51 and the second port P52, a parallel circuit defined by the inductor L51 and the capacitor C51, and a parallel circuit defined by the inductor L52 and the capacitor C52 are connected in series, and the connection point of these parallel circuits is grounded by the capacitor C53.

Figure 7:
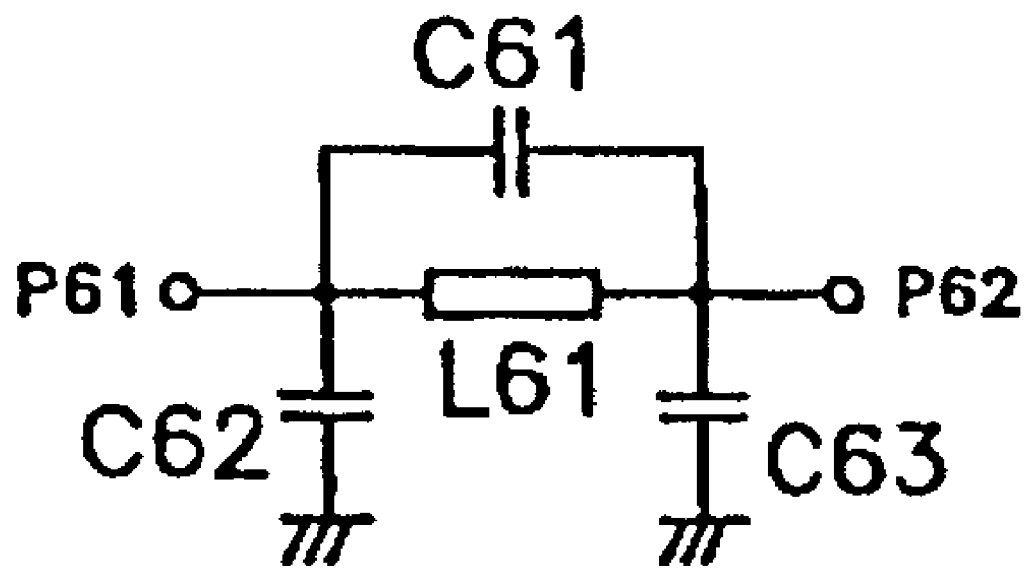
FIG. 7 is a circuit diagram of a second LC filter constituting the high-frequency module shown in FIG. 1.

FIG. 7 is a circuit diagram of the second LC filter 16 constituting the high-frequency module shown in FIG. 1. The second LC filter 16 is provided with the first and second ports P61 and P62, an inductor L61, and capacitors C61 to C63.

Between the first port P61 and the second port P62, a parallel circuit defined by the inductor L61 and the capacitor C61 is connected in series, and both ends of the parallel circuit are grounded through the capacitors C62 and C63.

Figure 8:
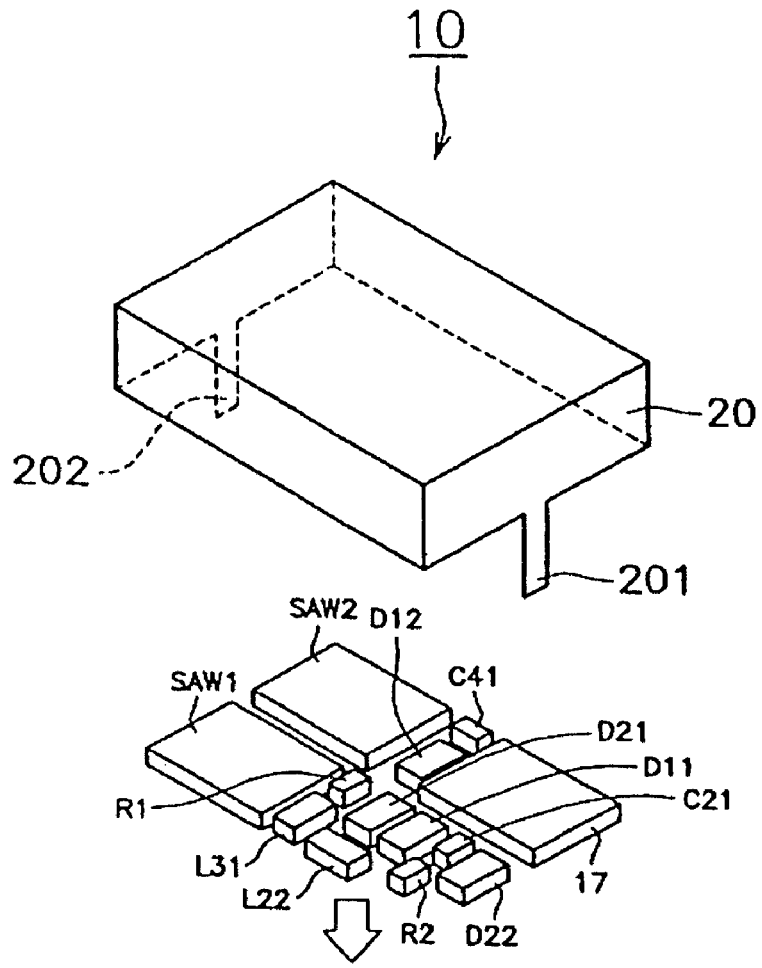
FIG. 8 is an exploded perspective view of a main portion of the high-frequency module shown in FIG. 1.
Figure 9A:
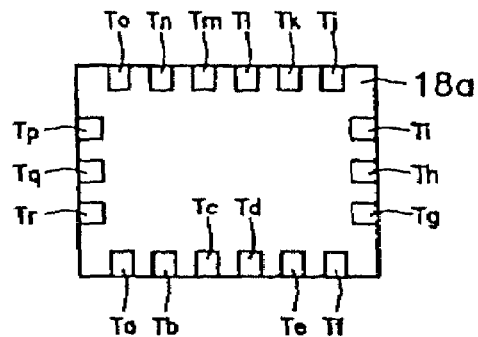
FIGS. 9(*a*) to FIG. 9(*h*) are top views of a first dielectric layer to an eighth dielectric layer constituting a laminated member of the high-frequency module shown in FIG. 8.
Figure 9B:
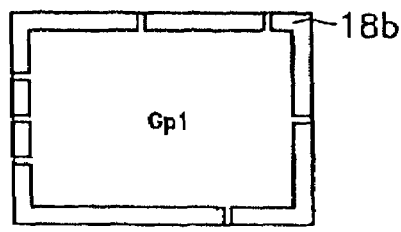
Figure 9C:
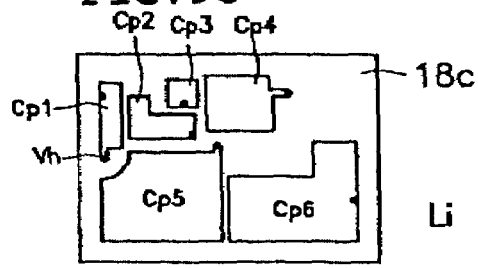
Figure 9D:
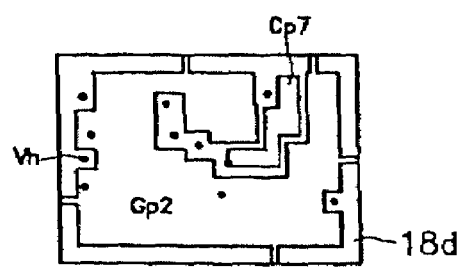
Figure 9E:
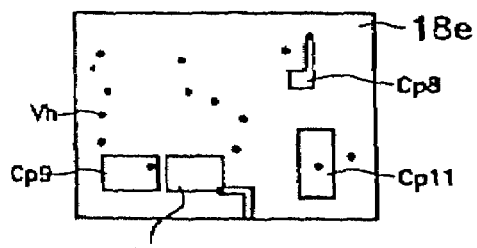
Figure 9F:
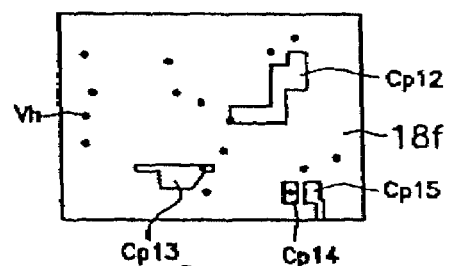
Figure 9G:
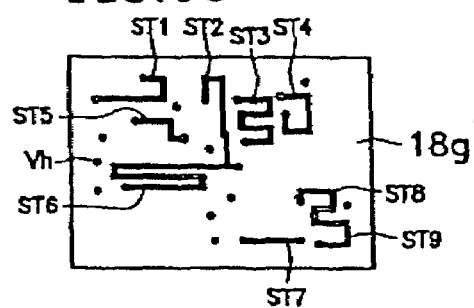
Figure 9H:
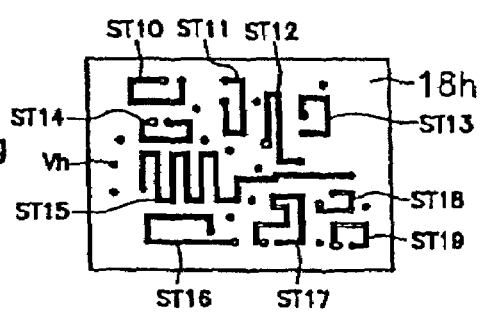
Figure 10A:
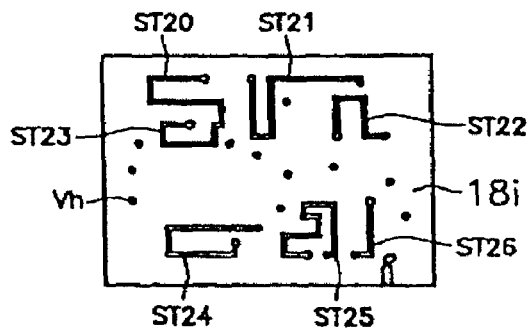
FIGS. 10(*a*) to FIG. 10(*f*) are top views of a ninth dielectric layer to a 13th dielectric layer constituting the laminated member of the high-frequency module shown in FIG. 8, and FIG. 10(*g*) is a bottom view of the 13th dielectric layer constituting the laminated member of the high-frequency module shown in FIG. 8.
Figure 10B:
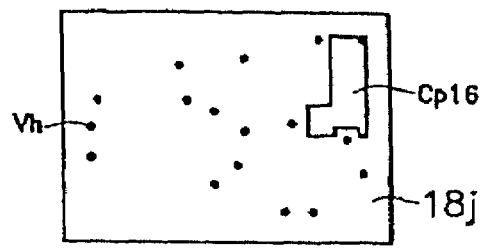
Figure 10C:
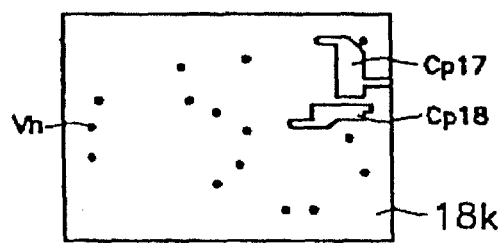
Figure 10D:
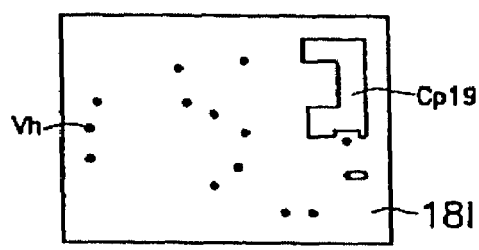
Figure 10E:
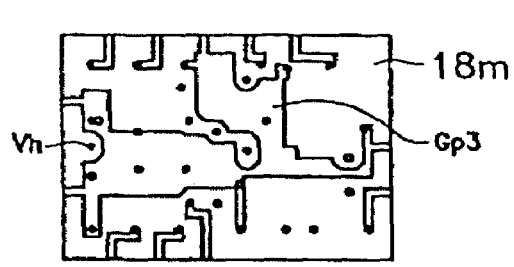
Figure 10F:
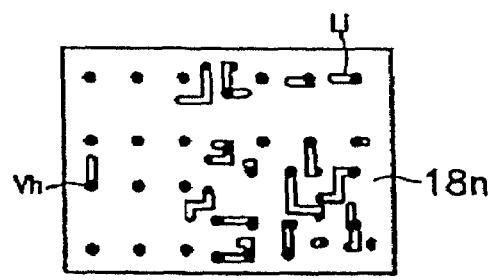
Figure 10G:
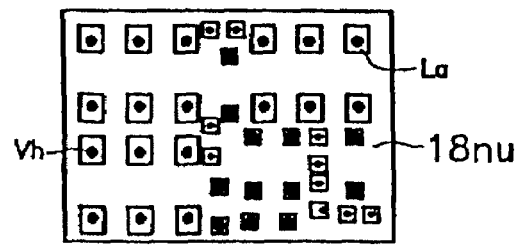

FIG. 8 is an exploded perspective view of a main section of the high-frequency module 10 having the circuit structure shown in FIG. 1. The high-frequency module 10 includes a laminated member 18. The laminated member 18 includes in its inside, although not shown, the inductors L11 and L12 and the capacitors C11 to C15 of the diplexer 11, the inductors L21 and L23 and the capacitor C22 of the first high-frequency switch 12, the inductor 32 and the capacitor C31 of the second high-frequency switch 13, the inductors L41 and L42 and the capacitors C42 to C44 of the SAW duplexer 14, the inductors L51 and L52 and the capacitors C51 to C53 of the first LC filter 15, and the inductor L61 and the capacitors C61 to C63 of the second LC filter 16.

The following elements are preferably mounted on the front surface of the laminated member 18: the diodes D11 and D12, the inductor (choke coil) L22, the capacitor C21, and the resistor R1 of the first high-frequency switch 12; the diodes D21 and D22, the inductor (choke coil) L31, and the resistor R2 of the second high-frequency switch 13; the SAW filters SAW1 and SAW2, and the capacitor C41 of the SAW duplexer 14; and the SAW filter 17.

From the side surfaces to the bottom surface of the laminated member 18, eighteen external terminals Ta to Tr extend. The external terminals Ta to Tr are preferably formed by screen printing or another suitable method. The external terminals Ta and Tb define the second port P42 of the SAW duplexer 14. The external terminal Tc defines the control terminal Vc1 of the first high-frequency switch 12. The external terminal Td defines the second port P62 of the second LC filter 16. The external terminal Tf defines the second port P52 of the first LC filter 15. The external terminal Tg defines the control terminal Vc2 of the second high-frequency switch 13. The external terminal Ti defines as the first port P11 of the diplexer 11. The external terminals Tk and Tl define the second port P72 of the SAW filter 17. The external terminals Tn and To define the third port P43 of the SAW duplexer 14. The external terminals Te, Th, Tj, Tm, Tp, Tq, and Tr define the ground terminals.

A metal cap 20 is placed on the laminated member 18 so as to cover the front surface of the laminated member 18. Protrusions 201 and 202 of the metal cap 20 are connected to the external terminals Th and Tq of the laminated member 18.

FIG. 9(*a*) to FIG. 9(*h*) and FIG. 10(*a*) to FIG. 10(*f*) are the top views of dielectric layers constituting the high-frequency module shown in FIG. 8, and FIG. 10(*g*) is the bottom view of the dielectric layer shown in FIG. 10(*f*). The laminated member 18 is preferably formed by sequentially laminating first to 14th dielectric layers 18*a* to 18*n* preferably made from ceramic having barium oxide, aluminum oxide, and silica as main components from the top, by baking at a baking temperature of about 1000° C. or more, and by turning it upside down. In other words, the 14th dielectric layer 18*n* defines the top layer of the laminated member 18, and the first dielectric layer 18*a* defines the bottom layer of the laminated member 18.

On the upper surface of the first dielectric layer 18*a*, the external terminals Ta to Tr are provided. On the upper surfaces of the second, fourth, and 13th dielectric layers 18*b*, 18*d*, and 18*m*, ground electrodes Gp1 to Gp3 are provided, respectively. On the upper surfaces of the third to sixth and 10th to 12th dielectric layers 18*c* to 18*f* and 18*j* to 18*l*, capacitor electrodes Cp1 to Cp19 are provided.

In addition, on the upper surfaces of the seventh to ninth dielectric layers 18*g* to 18*i*, stripline electrodes ST1 to ST26 are provided. On the upper surface of the 14th dielectric layer 18*n*, a wiring Li is provided.

Furthermore, on the lower surface of the 14th dielectric layer (18*nu* in FIG. 10(*g*)), lands La for mounting the diodes D11, D12, D21, and D22, the inductors L22 and L31, the capacitors C22 and C41, the resistors R1 and R2, and the SAW filters SAW1, SAW2, and 17 on the front surface of the laminated member 18 are provided. Via hole electrodes Vh are formed at predetermined positions in the third to 14th dielectric layers 18*c* to 18*n*.

With this structure, the inductor L11 (see FIG. 2) of the diplexer 11 includes the stripline electrodes ST4, ST13, and ST22, and the inductor L12 (see FIG. 2) includes the stripline electrodes ST2, ST11, and ST21. The capacitor C11 (see FIG. 2) preferably includes the capacitor electrodes Cp16, Cp17, and Cp19. The capacitor C12 (see FIG. 2) preferably includes the capacitor electrodes Cp16, Cp18, and Cp19. The capacitor C13 (see FIG. 2) preferably includes the capacitor electrode Cp4 and the ground electrodes Gp1 and Gp2. The capacitor C14 (see FIG. 2) is preferably includes the capacitor electrodes Cp7, Cp8, and Cp12. The capacitor C15 (see FIG. 2) preferably includes the capacitor electrodes Cp7 and Cp12 and the ground electrodes Gp1 and Gp2.

The inductor L21 (see FIG. 3) of the first high-frequency switch 12 includes the stripline electrodes ST7, ST17, and ST25, and the inductor L23 (see FIG. 2) includes the stripline electrodes ST3 and ST12. The capacitor C22 (see FIG. 3) includes the capacitor electrode Cp5 and the ground electrodes Gp1 and Gp2.

The inductor L32 (see FIG. 4) of the second high-frequency switch 13 includes the stripline electrodes ST6 and ST15. The capacitor C32 (see FIG. 4) includes the capacitor electrode Cp6 and the ground electrodes Gp1 and Gp2.

The inductor L41 (see FIG. 5) of the SAW duplexer 14 includes the stripline electrodes ST5, ST14, and ST23, and the inductor L42 (see FIG. 5) includes the stripline electrodes ST1, ST10, and ST20. The capacitor C42 (see FIG. 5) includes the capacitor electrode Cp3 and the ground electrodes Gp1 and Gp2, the capacitor C43 (see FIG. 5) includes the capacitor electrode Cp2 and the ground electrodes Gp1 and Gp2, and the capacitor C44 (see FIG. 5) includes the capacitor electrode Cp1 and the ground electrodes Gp1 and Gp2.

The inductor L51 (see FIG. 6) of the first LC filter 15 includes the stripline electrodes ST8, ST18, and ST26, and the inductor L52 (see FIG. 6) includes the stripline electrodes ST9 and ST19. The capacitor C51 (see FIG. 6) includes the capacitor electrodes Cp11 and Cp14, the capacitor C52 (see FIG. 6) includes the capacitor electrodes Cp11 and Cp15, and the capacitor C53 (see FIG. 6) includes of the capacitor electrode Cp11 and the ground electrode Gp2.

The inductor L61 (see FIG. 7) of the second LC filter 16 includes the stripline electrodes ST16 and ST24. The capacitor C61 (see FIG. 7) includes the capacitor electrodes Cp10 and Cp13, the capacitor C62 (see FIG. 7) includes the capacitor electrode Cp9 and the ground electrode Gp2, and the capacitor C63 (see FIG. 7) includes the capacitor electrode Cp10 and the ground electrode Gp2.

The operation of the high-frequency module 10 having the circuit structure shown in FIG. 1 will be described next. When a transmission signal is transmitted from the DCS (1.8 GHz band) or from the PCS (1.9 GHz band), a voltage of 1 V is applied to the control terminal Vc1 in the first high-frequency switch 12 to connect the first port P21 and the second port P22 in the first high-frequency switch 12 to transmit the transmission signal sent from the DCS or sent from the PCS, from the antenna ANT through the first LC filter 15, the first high-frequency switch 12, and the diplexer 11.

In this case, the first LC filter 15 passes the transmission signal sent from the DCS or the PCS and attenuates the harmonics of the transmission signal. In the second high-frequency switch 13, a voltage of 0 V is applied to the control terminal Vc2 to disable the second high-frequency switch 13.

When a transmission signal is transmitted from the GSM (900 MHz band), a voltage of 1 V is applied to the control terminal Vc2 in the second high-frequency switch 13 to connect the first port P31 and the second port P32 in the second high-frequency switch 13 to transmit the transmission signal sent from the GSM, from the antenna ANT through the second LC filter 16, the second high-frequency switch 13, and the diplexer 11.

In this case, the second LC filter 16 passes the transmission signal sent from the GSM and attenuates the harmonics of the transmission signal. In the first high-frequency switch 12, a voltage of 0 V is applied to the control terminal Vc1 to disable the first high-frequency switch 12.

When a receiving signal for the DCS is received, a voltage of 0 V is applied to the control terminal Vc1 of the first high-frequency switch 12 to connect the first port P21 and the third port P23 in the first high-frequency switch 12, and the DCS receiving signal is sent to the second port P42 side in the SAW duplexer 14, so that the DCS receiving signal received by the antenna ANT is sent to the receiving section Rxd of the DCS through the diplexer 11, the first high-frequency switch 12, and the SAW duplexer 14.

In this case, the SAW duplexer 14 passes the DCS receiving signal and attenuates the harmonics of the receiving signal. In the second high-frequency switch 13, a voltage of 0 V is applied to the control terminal Vc2 to disable the second high-frequency switch 13.

When a receiving signal for the PCS is received, a voltage of 0 V is applied to the control terminal Vc1 in the first high-frequency switch 12 to connect the first port P21 and the third port P23 in the first high-frequency switch 12, and the PCS receiving signal is sent to the third port P43 side in the SAW duplexer 14, so that the PCS receiving signal received by the antenna ANT is sent to the receiving section Rxp of the PCS through the diplexer 11, the first high-frequency switch 12, and the SAW duplexer 14.

In this case, the SAW duplexer 14 passes the PCS receiving signal and attenuates the harmonics of the receiving signal. In the second high-frequency switch 13, a voltage of 0 V is applied to the control terminal Vc2 to disable the second high-frequency switch 13.

When a receiving signal for the GSM is received, a voltage of 0 V is applied to the control terminal Vc2 in the second high-frequency switch 13 to connect the first port P31 and the third port P33 in the second high-frequency switch 13 to send the GSM receiving signal received by the antenna ANT to the receiving section Rxg of the GSM through the diplexer 11, the second high-frequency switch 13, and the SAW filter 17.

In this case, the SAW filter 17 passes the GSM receiving signal and attenuates the harmonics of the receiving signal. In the first high-frequency switch 12, a voltage of 0 V is applied to the control terminal Vc1 to disable the first high-frequency switch 12.

According to the high-frequency module of the above-described preferred embodiment, since the diplexer, the first and second high-frequency switches, and the SAW duplexer are provided, and the SAW duplexer separates the receiving section of the first communication system and the receiving section of the second communication system, the number of high-frequency switches is reduced. As a result, the number of diodes used is reduced, and the power consumption of the high-frequency modules is greatly reduced. In addition, a current is not required during a signal receiving operation.

Since the diplexer, the first and second high-frequency switches, and the SAW duplexer, which constitute the high-frequency module, are integrated into the laminated member obtained by laminating a plurality of sheet layers formed of ceramic, the matching characteristic, the attenuation characteristic, or the isolation characteristic of each component is obtained. Therefore, a matching circuit is not required between the diplexer and the first and second high-frequency switches, or between the first high-frequency switch and the SAW duplexer. Consequently, the high-frequency module is very compact. In on example of preferred embodiments of the present invention, the resulting laminated member had approximate dimensions of 7.0 mm by 5.0 mm by 1.8 mm, and the laminated member included the diplexer, the first and second high-frequency switches, the SAW duplexer, the first and second LC filters, and the SAW filter.

The diplexer preferably includes inductors and capacitors. The first and second high-frequency switches preferably includes diodes, inductors, and capacitors. The SAW duplexer preferably includes SAW filters and transmission lines. The first and second LC filters preferably include inductors and capacitors. All of these elements are preferably built into, or mounted on the laminated member, and are preferably connected by connection members located inside of the laminated member. Therefore, the high-frequency module is defined by a single laminated member and is very compact. In addition, a loss caused by wirings for connecting components is greatly reduced, and as a result, the loss of the entire high-frequency module is greatly reduced.

Since the lengths of the inductors and the transmission lines built in the laminated member are reduced by a wavelength reduction effect, the insertion losses of these inductors and transmission lines are greatly reduced. Therefore, a compact and low-loss high-frequency module can be produced, and a compact and high-performance mobile communication apparatus on which the high-frequency module is mounted can also be produced.

Figure 11:
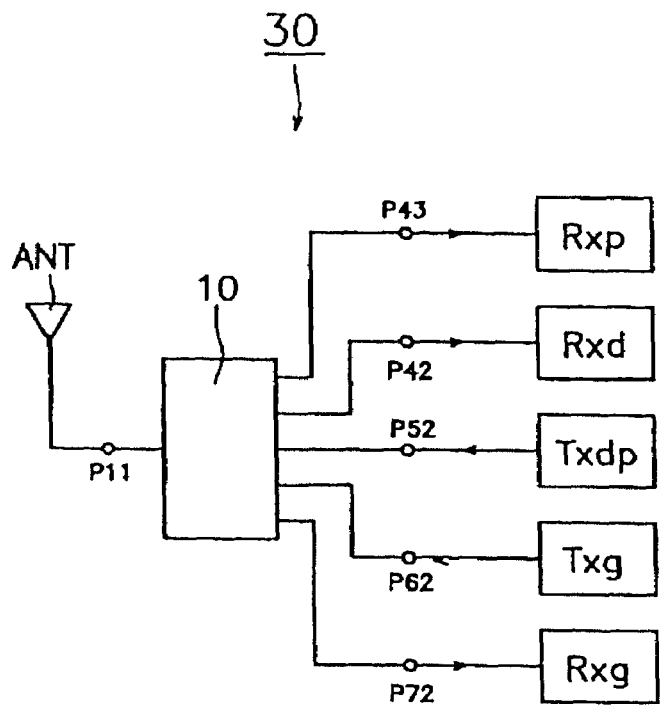
FIG. 11 is a block diagram showing a portion of the structure of a mobile communication apparatus using the high-frequency module shown in FIG. 1.
Figure 12:
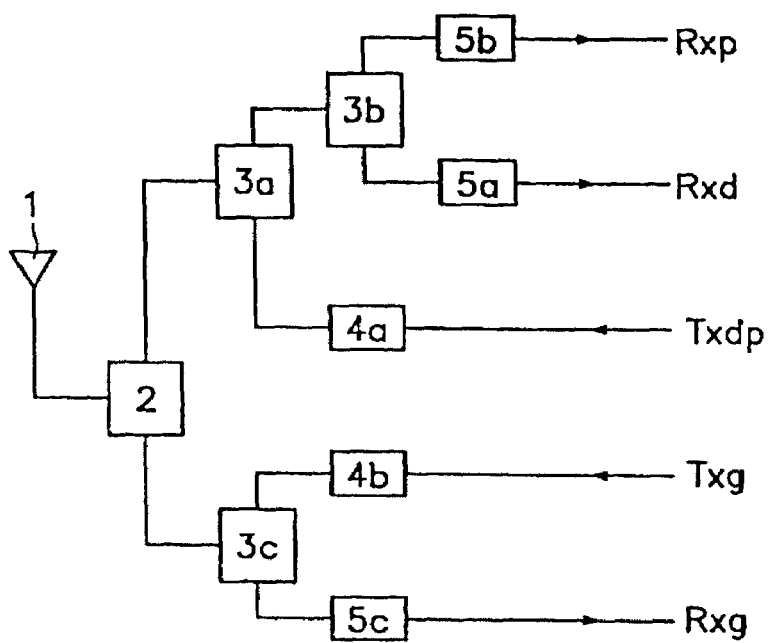
FIG. 12 is a block diagram showing the structure of a front end section of a general triple-band portable telephone (mobile communication apparatus).

FIG. 11 is a block diagram showing a portion of the structure of a triple-band portable telephone, which is a mobile communication apparatus. In this telephone, a DCS using the 1.8 GHz band, a PCS using the 1.9 GHz band, and a GSM using the 900 MHz band are preferably combined.

The triple-band portable telephone 30 is provided with the high-frequency module 10 (see FIG. 1), in which an antenna ANT and the front end sections of the DCS, the PCS, and the GSM are integrated, a transmission section Txdp shared by the DCS and the PCS, a receiving section Rxp of the PCS, a receiving section Rxd of the DCS, a transmission section Txg of the GSM, and a receiving section Rxg of the GSM.

The port P11 of the high-frequency module 10 is connected to the antenna ANT, and the ports P43, P42, P52, P62, and P72 are connected to the receiving section Rxp of the PCS, the receiving section Rxd of the DCS, the transmission section Txdp common to the DCS and the PCS, the transmission section Txg of the GSM, and the receiving section Rxg of the GSM, respectively.

According to the triple-band portable telephone described above, since the high-frequency module greatly reduces power consumption and does not require a current during receiving, the mobile communication apparatus having this high-frequency module can have low power consumption and does not use any current when waiting for a call. As a result, a battery mounted in the mobile communication apparatus can be used for a much longer period.

In addition, since the compact and low-loss high-frequency module is used, the mobile communication apparatus having this high-frequency module is very compact and provides excellent performance.

In the high-frequency module of various preferred embodiments described above, the laminated member preferably includes in the inside thereof, all of the elements of the diplexer, and a portion of the elements of the first and second high-frequency switches and the SAW duplexer, and the remaining elements of the first and second high-frequency switches and the SAW duplexer are mounted on the laminated member. A structure in which all the elements of the diplexer, the first and second high-frequency switches, and the SAW duplexer are mounted on the same printed circuit board may be used. Alternatively, a structure in which all the elements of the diplexer, and a portion of the elements of the first and second high-frequency switches and the SAW duplexer are built in a laminated member, and the remaining elements of the first and second high-frequency switches and the SAW duplexer are mounted on the same printed circuit board may be used.

In the above case, the phase conversion units of the SAW duplexer are preferably defined by lumped constant elements obtained by combining inductors and capacitors. Even if the phase conversion units are defined by distributed constant elements such as striplines, the same advantages are obtained.

In the above case, the SAW filters are mounted on the front surface of the laminated member. They may be mounted in a cavity formed on the lower surface or each surface of the laminated member.

In the above case, the SAW filters are bare chip elements but may also be disposed in a package.

While the present invention has been particularly shown and described with reference to preferred embodiments thereof, it will be understood by those skilled in the art that the foregoing and other changes in form and details can be made without departing from the spirit and scope of the invention.

What is claimed is:

1. A switching module for switching between a plurality of communication systems comprising:
    a laminated body having a plurality of layers, including a top layer and a bottom layer;
    a ground electrode located on, or near, the bottom layer;
    at least one SAW filter disposed on the top layer;
    a plurality of switches for the plurality of communication systems;
    a plurality of receiving terminals for the plurality of communication systems, each of the plurality of receiving terminals is connected to one of the plurality of switches;
    a plurality of transmitting terminals for the plurality of communication systems, each of the plurality of transmitting terminals is connected to one of the plurality of switches; and
    a diplexer connected between an antenna and each of the plurality of switches; wherein
    the at least one SAW filter is directly connected to one end of a viahole and the ground electrode is directly connected to the other end of the viahole.

2. A switching module according to claim 1, further comprising at least one LC filter connected between the diplexer and one of the plurality of transmitting terminals.

3. The high frequency module according to claim 1, wherein the diplexer further includes at least one of a low-pass filter and a high-pass filter.

4. A switching module according to claim 1, wherein the plurality of receiving terminals includes three receiving terminals and the plurality of transmitting terminals includes two transmitting terminals.

5. A switching module for switching between a plurality of communication systems comprising:
    a laminated body having a plurality of layers, including a top layer and a bottom layer;
    a ground electrode located on, or near, the bottom layer;
    at least one SAW filter disposed on the top layer;
    a plurality of switches for the plurality of communication systems;
    a plurality of receiving terminals for the plurality of communication systems, each of the plurality of receiving terminals is connected to one of the plurality of switches;
    a plurality of transmitting terminals for the plurality of communication systems, each of the plurality of transmitting terminals is connected to one of the plurality of switches; and
    a duplexer connected to one of the plurality of switches and at least two of the plurality of receiving terminals for the plurality of communication systems; wherein
    the at least one SAW filter is directly connected to one end of a viahole and the ground electrode is directly connected to the other end of the viahole.

6. A switching module according to claim 5, wherein the plurality of receiving terminals includes three receiving terminals and the plurality of transmitting terminals includes two transmitting terminals.

7. A high-frequency module comprising:
    an antenna;
    a diplexer connected to the antenna;
    a first switch connected to the diplexer;
    a second switch connected to the diplexer;
    a duplexer connected to the first switch;
    a receiving terminal for a first communication system connected to the duplexer;
    a receiving terminal for a second communication system connected to the duplexer;
    a transmitting terminal for the first and the second communication systems connected to the first switch;
    a receiving terminal for a third communication system connected to the second switch; and
    a transmitting terminal for the third communication system connected to the second switch.

8. A high-frequency module according to claim 7, wherein the diplexer includes:
    a high-pass filter connected to the antenna and the first switch; and
    a low-pass filter connected to the antenna and the second switch.

9. A high-frequency module according to claim 7, further comprising a plurality of laminated sheets, including top and bottom laminated sheets.

10. A high frequency module according to claim 9, wherein at least a portion of a phase conversion component of the duplexer is disposed on at least one of the plurality of laminated sheets disposed between the top and bottom laminated sheets.

11. A high frequency module according to claim 10, wherein the phase conversion component includes at least one transmission line disposed on the at least one of the plurality of laminated sheets.

12. A high frequency module according to claim 9, further comprising a SAW filter disposed on the top laminated sheet that is connected through a viahole to a ground plane located on or near the bottom laminated sheet.

13. A high frequency module according to claim 7, wherein the duplexer includes:
- a SAW filter; and
- a phase conversion component.

14. A switching method for at least first, second, and third communication systems, the method comprising the steps of:
- filtering a signal transferred between an antenna and a first switch to produce a first signal having a first frequency range by using a diplexer;
- filtering a signal transferred between the antenna and a second switch to produce a second signal having a second frequency range by using the diplexer;
- switching between a signal transmission between the diplexer and a duplexer and a signal transmission between the diplexer and a transmitting terminal for the first and the second communication systems by using the first switch;
- filtering a signal transferred between the first switch and a receiving terminal for the first communication system to produce a third signal having a first frequency sub-range by using the duplexer;
- filtering a signal transferred between the first switch and a receiving terminal for the second communication system to produce a fourth signal having a second frequency sub-range by using the duplexer;
- switching between a signal transmission between the diplexer and a receiving terminal for a third communication system and a signal transmission between the diplexer and a transmitting terminal for the third communication system by using the second switch.

15. A switching method according to claim 14, wherein the diplexer includes:
- a high-pass filter connected to the antenna and the first switch; and
- a low-pass filter connected to the antenna and the second switch.

16. A switching method according to claim 14, further comprising the step of providing a plurality of laminated sheets, including top and bottom laminated sheets.

17. A switching method according to claim 16, wherein at least a portion of a phase conversion component of the duplexer is disposed on at least one of the plurality of laminated sheets between the top and bottom laminated sheets.

18. A switching method according to claim 17, wherein the phase conversion component includes at least one transmission line formed on the at least one of the plurality of laminated sheets.

19. A switching method according to claim 16, further comprising the step of providing a SAW filter disposed on the top laminated sheet that is connected through a viahole to a ground plane located on or near the bottom laminated sheet.

20. A switching method according to claim 14, wherein the duplexer includes:
- a SAW filter; and
- a phase conversion component.

* * * * *